(12) United States Patent  
Ohkubo et al.

(10) Patent No.: US 7,414,240 B2
(45) Date of Patent: Aug. 19, 2008

(54) PARTICLE REMOVER, EXPOSURE APPARATUS HAVING THE SAME, AND DEVICE MANUFACTURING METHOD

(75) Inventors: Akinori Ohkubo, Utsunomiya (JP); Kenji Yamazoe, Utsunomiya (JP); Hiroshi Osawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 11/255,530

(22) Filed: Oct. 20, 2005

(65) Prior Publication Data

US 2006/0086371 A1 Apr. 27, 2006

(30) Foreign Application Priority Data

Oct. 22, 2004 (JP) ............... 2004-307860

(51) Int. Cl.
*H01S 1/00* (2006.01)
*H01S 3/00* (2006.01)
*H05H 3/02* (2006.01)

(52) U.S. Cl. ............... 250/251; 250/492.2; 250/492.23; 355/30; 355/75; 355/67; 430/2; 430/296

(58) Field of Classification Search ................. 250/251, 250/492.2, 492.23; 355/30, 75, 67; 430/5, 430/296
See application file for complete search history.

(56) References Cited

U.S. PATENT DOCUMENTS 6,038,015 A * 3/2000 Kawata ...................... 355/67

2002/0029956 A1 * 3/2002 Allen ...................... 204/157.15
2006/0077361 A1 * 4/2006 Sogard ...................... 355/30

FOREIGN PATENT DOCUMENTS

JP 5-100182 4/1993

OTHER PUBLICATIONS

Tam et al, "Laser-cleaning techniques for removal of surface particulates," J. Appl. Phys. 71(7). pp. 3515-3523, Apr. 1, 1992.
Svoboda, et al, Optical trapping of metallic Raleigh particles;: Optical Letters, vol. 19, No. 13, pp. 930-932, Jul. 1, 1994.
Arthur Ashkin, "Optical trapping and manipulation of neural particles using lasers," Proc. Natl. Acad. Sci. U.S.A., vol. 94 pp. 4853-4860 (1997).
Moors et al, "Electrostatic mask protection for extreme ultraviolet lithography", Journal of Vacuum Science & Technology B, vol. 20, No. 1, pp. 316-320 (2002).
Rader et al, "Verification studies of thermophoretic protection of EUV masks," Emerging Lithographic Technologies VI, SPIE Proceedings vol. 468 pp. 182-193, (2002).

* cited by examiner

*Primary Examiner*—Jack I. Berman
*Assistant Examiner*—Meenakshi S Sahu
(74) *Attorney, Agent, or Firm*—Morgan & Finnegan, LLP

(57) ABSTRACT

A particle remover includes an irradiation unit for irradiating plural lights onto a target from different directions, and for scanning the lights on the target, and a collector for collecting particles carried as a result of scanning of the lights.

12 Claims, 9 Drawing Sheets

PRIOR ART

PARTICLE REMOVER, EXPOSURE APPARATUS HAVING THE SAME, AND DEVICE MANUFACTURING METHOD

BACKGROUND OF THE INVENTION

The present invention relates generally to a remover, and more particularly to a particle remover that removes particles adhered to a reticle for an exposure apparatus that manufactures such devices as a single crystal substrate for a wafer, and a glass plate for a liquid crystal display ("LCD"). An application of the inventive particle remover is not limited to an exposure apparatus. Rather, the particle remover can be broadly applied to such optical apparatuses, as photoengraving, measuring projectors, motion picture projectors, and other projectors.

In manufacturing fine semiconductor devices, such as a semiconductor memory and a logic circuit, using the photolithography technology, a reduction projection exposure apparatus has conventionally been employed which uses a projection optical system to project a circuit pattern of a mask or a reticle onto a wafer, etc. to transfer the circuit pattern.

The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. In order to meet the recent demand for finer processing to semiconductor devices, use of exposure light that has a smaller wavelength have been promoted from an ultra-high pressure mercury lamp (such as the i-line with a wavelength of approximately 365 nm) to the KrF excimer laser (with a wavelength of approximately 248 nm) and the ArF excimer laser (with a wavelength of approximately 193 nm).

However, the lithography using the UV light has the limit to satisfy the rapidly promoting fine processing of a semiconductor device, and a reduction projection optical system using extreme ultraviolet ("EUV") light with a wavelength of 10 to 15 nm smaller than that of the UV light has been developed for efficient transfers of a very fine circuit pattern of 0.1 µm or less.

The exposure apparatus is required to accurately transfer the reticle pattern onto the substrate, and the conventional reticle has a pellicle so as to prevent particles that deteriorate the pattern transfer from adhering to the reticle. The pellicle is a thin film having high transmittance to the exposure light, a predetermined distance apart from the reticle. FIG. 13 is a schematic sectional view of the conventional reticle 1000 having a pellicle 1300. The reticle 1000 includes, as shown in FIG. 13, a substrate 1100, an absorber 1200, and the pellicle 1300. Exposure light EL is irradiated onto the reticle 1000, diffracted by the absorber 1200, generates diffracted light DL, and enters a projection optical system. Particles MP adhered to the pellicle 1300 are a predetermined distance apart from the reticle pattern or the absorber 1200, and are not imaged on a wafer due to defocus.

However, all the materials have high absorptance to the EUV light in the EUV exposure apparatus, and there are practically no materials usable for the pellicle. Accordingly, a configuration that removes a pellicle from a reticle is considered for the EUV exposure apparatus.

FIG. 14 is a schematic sectional view showing a reticle 2000 applicable to the EUV exposure apparatus. The reticle 2000 includes a substrate 2100 having a reflective multilayer film or coating, and an absorber 2200. The exposure light EL is irradiated into the reticle 2000, and generates the diffracted light DL via the reticle pattern or the absorber 2200. The particles MP that adhere to the reticle 2000 cause patterning defects that remarkably lower the yield of the manufactured semiconductor device. One proposal to reduce particle adhesions to the reticle uses a photoelectron method using the thermophoretic and/or electrostatic force. See, for example, D. J. Rader, D. E. Dedrick, E. W. Beyer, A. H. Leung and L. E. Klebanoff, "Verification studies of thermophoretic protection of EUV masks," Emerging Lithographic Technologies VI, SPIE Proceedings Vol. 4688 (2002), and R. Moors, G.-J. Heerens, "Electorostatic mask protection for extreme ultraviolet lithography", Journal of Vacuum Science & Technology B, Vol. 20, No. 1, pp. 316-320 (2002).

Another proposed particle removing technology is removing particles inside the exposure apparatus. For example, Japanese Patent Application, Publication No. 5-100182 proposes the removing technology of the particles or absorptive materials by using the light and by activating a collector having a transparent characteristic. The optical trap technology that condenses a laser beam and removes the particles utilizing the light intensity gradient near the condensing point is disclosed, for example, by Karel Svoboda and Steven M. Block, "Optical trapping of metallic Rayleigh particles," Optics Letters, vol. 19, No. 13, 1 Jul. 1994, and Arthur Ashkin, "Optical trapping and manipulation of neutral particles using lasers," Proc. Natl. Acad. Sci. U.S.A. Vol. 94 pp. 4853-4860 (1997). The particle removing technology through the laser shock wave is disclosed, for example, in Andrew C. Tam, Wing P. Leung, Werner Zapka and Winfrid Ziemlich, "Laser-cleaning techniques for removal of surface particulates," J. Appl. Phys. 71(7), 1 Apr. 1992, although the technology is not for the reticle used for the EUV exposure apparatus. However, the prior art cannot satisfactorily remove the particles from the reticle, resulting in defects in the transferred pattern and lowered throughput due to a long time to remove the particles.

For example, Japanese Patent Application, Publication No. 5-100182 requires one collector for each absorptive material and is limited by the size of the collectable particle. In addition, when a particle is located, for example, between two adjacent convexes, in a solid structure (solid protruding artifact) that has a non-flat or undulating surface, the solid structure may obstruct the collection. Moreover, a method of removing a particle by irradiating the light onto it in one direction does not work if a structure blocks the light before the particle and cannot remove the particle.

Furthermore, the prior art reference entitled "Laser-cleaning techniques for removal of surface particulates" problematically causes damages of the reticle in removing the particles from it.

BRIEF SUMMARY OF THE INVENTION

The present invention is directed to a particle remover that removes particles from a target, such as a reticle, without damaging the target without being restricted by a shape or structure of the target, an exposure apparatus having the same, and a device manufacturing method.

A particle remover according to one aspect of the present invention includes an irradiation unit for irradiating plural lights onto a target from different directions, and for scanning the lights on the target, and a collector for collecting particles carried as a result of scanning of the lights.

An exposure apparatus according to another aspect of the present invention includes the above particle remover, and an optical system for exposing onto a substrate a pattern of a reticle, from which a particle is removed by said particle remover.

A device manufacturing method according to still another aspect of the present invention includes the steps of exposing a substrate using the above apparatus, and developing the substrate that has been exposed object.

Other objects and further features of the present invention will become readily apparent from the following description of the preferred embodiments with reference to accompanying drawings.

DETAILED DESCRIPTION OF THE PREFERRED EMBODIMENTS

Figure 1:
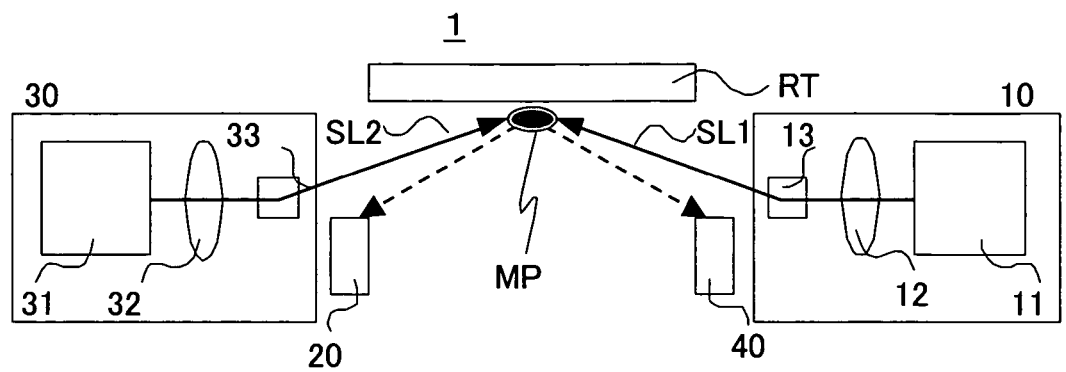
FIG. 1 is a schematic block diagram of a structure of a particle remover according to one aspect of the present invention.

Referring now to the accompanying drawings, a description will be given of a particle remover according to one aspect of the present invention. Like elements in each figure are designated by the same reference numerals, and a description thereof will be omitted. FIG. 1 is a schematic block diagram of a structure of the inventive remover 1.

The remover 1 is one that removes particles from a target, and suitable for the target having a solid structure, which will be described later. A description will now be given of a removal of the particle MP that has adhered to a reticle RT as a target. The remover 1 includes, as shown in FIG. 1, a first irradiation unit 10, a first collector 20, a second irradiation unit 30, and a second collector 40.

The first irradiation unit 10 includes a light source 11, a condenser lens 12, and a light scanning optical system 13, such as a galvano mirror. The second irradiation unit 30 is located at a position different from the first irradiation unit 10, and includes a light source 31, a condenser lens 32, and a light scanning optical system 33, such as a galvano mirror.

The condenser lens 12 condenses the light that originates from the light source 11 in the first irradiation unit 10. The light scanning optical system 13 scans the condensed light, and irradiates the scanned light SL1 onto the reticle RT surface. The condenser lens 32 condenses the light that originates from the light source 31 in the first irradiation unit 30. The light scanning optical system 33 scans the condensed light, and irradiates the scanned light SL2 onto the reticle RT surface.

The light scanning optical systems 13 and 33 carry the particle MP captured by the optical trap effect of the lights SL1 and SL2 on the reticle RT to the first and second collector 20 and 40. Even when the reticle pattern or solid structure obstructs one of the lights SL1 and SL2 in scanning the overall surface on the reticle RT by the lights SL1 and SL2, the other one of the lights SL1 and SL2 can remove the particle MP. Thereby, for example, in the scan exposure, the particles that cause patterning defects can be removed without interrupting the exposure, as long as the particles are removed from the area other than the slit width used for the exposure. In an alternate embodiment, a detector may previously detect the particle and specify its position on the reticle, and the lights SL1 and/or SL2 are irradiated onto the specified position.

Thus, the remover 1 of this embodiment uses plural irradiation units, i.e., the first and second irradiation units 10 and 30, to remove the particle MP, and irradiates the lights SL1 and SL2 from different directions onto the reticle RT, thereby removing particles MP from the non-flat or undulating reticle RT (because it has a reticle pattern or a solid structure).

While the remover 1 in this embodiment uses plural collectors, i.e., the first and second collectors 20 and 40, the number of collectors may be one. While this embodiment uses the light SL1 emitted from the first irradiation unit 10 and the light SL2 emitted from the second irradiation unit 30, more irradiation units or more lights may be used.

Figure 2:
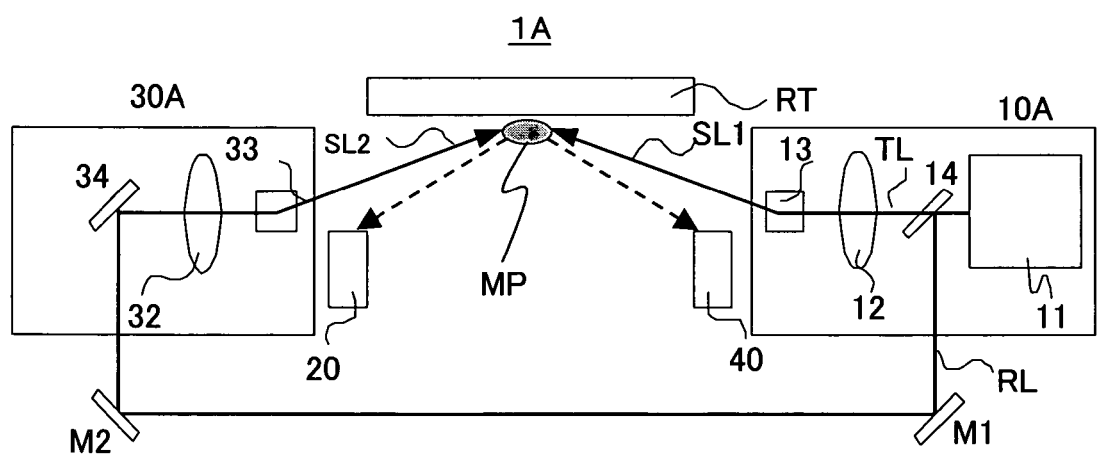
FIG. 2 is a schematic block diagram of a variation of the particle remover shown in FIG. 1.

Referring now to FIG. 2, a description will be given of a remover 1A as a variation of the remover 1. The remover 1A is one that removes the particles from the target, similar to the remover 1. Here, FIG. 2 is a schematic block diagram of the structure of the remover 1A as one variation of the remover 1.

The remover 1A includes a first irradiation unit 10A, the first collector 20, a second irradiation unit 30A, the second collector 40, and mirrors M1 and M2 that guide light RL split from the first irradiation unit 10A to the second irradiation unit 30A.

The first irradiation unit 10A includes the light source 11, the condenser lens 12, the light scanning optical system 13, such as a galvano mirror, a beam splitter 14 that splits the light from the light source 11. The second irradiation unit 30A includes the condenser lens 32, the light scanning optical system 33, such as a galvano mirror, and a mirror 34.

The light that originates from the light source 11 is incident upon the beam splitter 14, and transmits through or is reflected on the beam splitter 14. The condenser lens condenses light TL that transmits the beam splitter 14. The light scanning optical system 13 scans the condensed light, and irradiates the scanned light SL1 onto the reticle RT surface.

The mirrors M1 and M2 guide light RL reflected on the beam splitter 14 to the second irradiation unit 30A. The condenser lens 32 condenses the light RL that is guided to the second irradiation unit 30A. The light scanning optical system 33 scans the condensed light, and irradiates the scanned light SL2 onto the reticle RT surface. The beam splitter 14 splits the light that originates from the light source 11 in the first irradiation unit 10A, and guides the light to the second irradiation unit 30A. Thus, the second irradiation unit 30A needs no light source, and the cost of the light source is reduced.

The light scanning optical systems 13 and 33 carry the particle MP captured by the light trap effect of the lights SL1 and SL2 on the reticle RT to the first and second collector 20 and 40. Even when the mask pattern or solid structure obstruct one of the lights SL1 and SL2 by scanning the overall surface on the reticle RT by the lights SL1 and SL2, the other one of the lights SL1 and SL2 can remove the particle MP. In addition, a detector may previously detect the particle and specify its position on the reticle, and the lights SL1 and/or SL2 may be irradiated only onto the position.

The remover 1A of this embodiment uses plural irradiation units, i.e., the first and second irradiation units 10A and 30A to remove the particle MP, and irradiates the lights SL1 and SL2 from different directions on the reticle RT, thereby removing particle MP from the non-flat or undulating reticle RT (because it has a reticle pattern or a solid structure).

While the remover 1 in this embodiment uses plural collectors, i.e., the first and second collectors 20 and 40, the number of collectors may be one. While this embodiment uses the light SL1 emitted from the first irradiation unit 10A and the light SL2 emitted from the second irradiation unit 30A, more irradiation units or more lights may be used. Even in this case, a new light source is not needed, and use of plural beam splitters may split the light from the light source 11 in the first irradiation unit 10 into plural beams and guide them to corresponding irradiation units.

Figure 3:
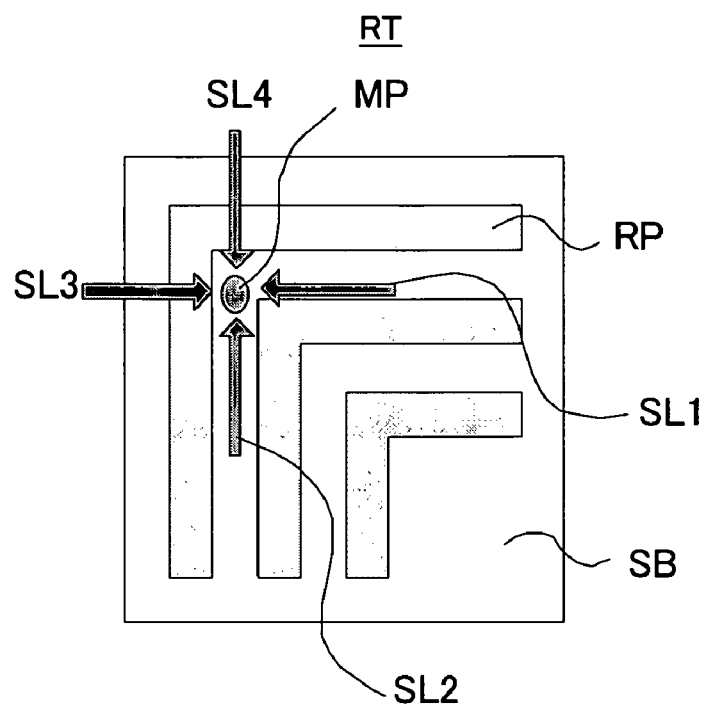
FIG. 3 is a schematic top view of a reticle showing a light irradiation direction upon the reticle.

Referring now to FIG. 3, a detailed description will be given of a capture of the particle MP on the reticle RT using the light SL1 or SL2. FIG. 3 is a schematic top view of the reticle RT showing the light irradiation direction onto the reticle RT. The reticle RT has, as shown in FIG. 3, a substrate SB and a reticle pattern RP.

The substrate SB is part of the target surface from which the particle MP is to be removed. The reticle pattern RP is made of a light absorber, such as Cr, and formed on the substrate SB. The reticle pattern RP absorbs the light, and has a finite thickness. Therefore, the light SL3 is shielded among the lights SL1 and SL3 perpendicular to the reticle RT, and does not reach the particle MP to be removed. On the other hand, the light SL1 is not shielded by the reticle pattern RP, and reaches the particle MP. The light SL4 is shielded among the lights SL2 and SL4 perpendicular to the reticle RT, and does not reach the particle MP to be removed. The light SL2 is not shielded by the reticle pattern RP, and reaches the particle MP.

The lights SL1 and SL2 perpendicular to the reticle RT are irradiated orthogonally onto the reticle RT. This configuration enables the lights to reach and remove the particle MP without being blocked by a two-directionally extending circuit pattern or the reticle pattern RP. The orthogonal irradiations of two beams onto the particle can stably capture and remove the particle, as disclosed in the above prior art reference entitled "Optical trapping and manipulation of neutral particles using lasers."

Figure 4:
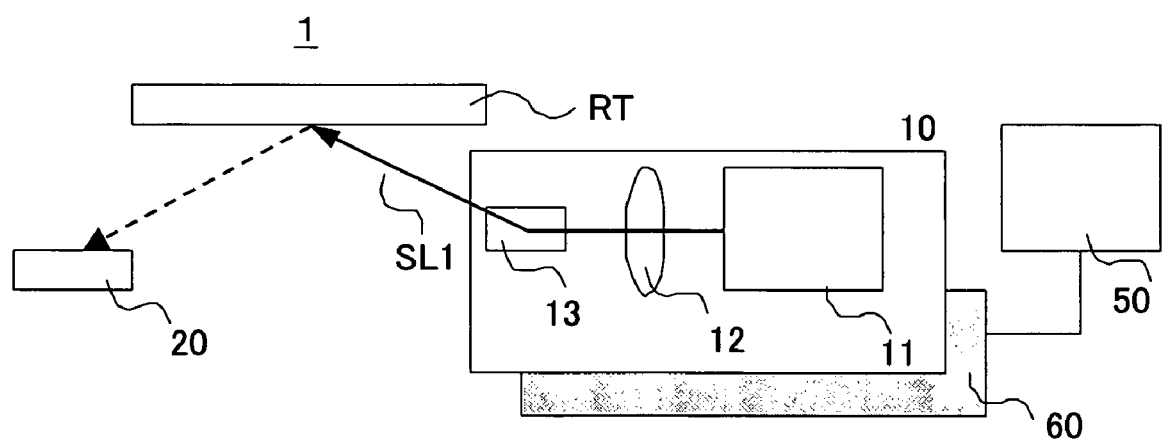
FIG. 4 is a schematic block diagram of a structure of a particle remover having a memory and a stage.

The removers 1 and 1A may include, as shown in FIG. 4, a memory 50 and a stage 60. In this case, the memory 50 stores the reticle pattern RP or the solid structure of the reticle RT as the target. The stage 60 moves the first irradiation unit 10 to irradiate the light SL1 so that the reticle pattern RP does not block the light SL1.

Thereby, the removers 1 and 1A are configured to refer to the reticle pattern RP stored in the memory 50, and adjust the irradiation direction or angle of the SL1 so that the reticle pattern RP does not block the light SL1. Here, FIG. 4 is a schematic block diagram showing a structure of the remover 1 having the memory 50 and the stage 60. While FIG. 4 omits the second irradiation unit 30, it may move with the stage similar to the first irradiation unit 10.

When a reticle RT as a target has a solid pattern for a semiconductor circuit, the memory 50 previously stores the known reticle pattern RP. In irradiating the light SL1 onto the reticle RT, information of the scan position of the light SL1 of the reticle pattern RP is read from the memory 50, and a controller (not shown) moves the first irradiation unit 30 through the stage 60 and controls the irradiation direction of the light SL1. Thereby, the light SL1 that is not blocked by the reticle pattern RP can be irradiated onto the reticle RT, and remove the particles MP efficiently. Control methods of the irradiation direction of the light SL1 include a method to adjust the irradiation direction of the light SL1 through an optical element and a method to select light in an appropriate direction to be irradiated onto the reticle from among lights in plural directions and as well as a method to move the first irradiation unit 10 through the stage 60.

A reticle used for the EUV exposure apparatus may have an absorber on the substrate that has a thickness equal to or greater than the reticle pattern interval. In this case, when the angle of the light irradiated onto the reticle is acute to the reticle, the light is blocked by the reticle pattern and cannot remove a particle in the reticle pattern. In particular, it is extremely difficult to remove a particle in a contact hole pattern.

Figure 5:
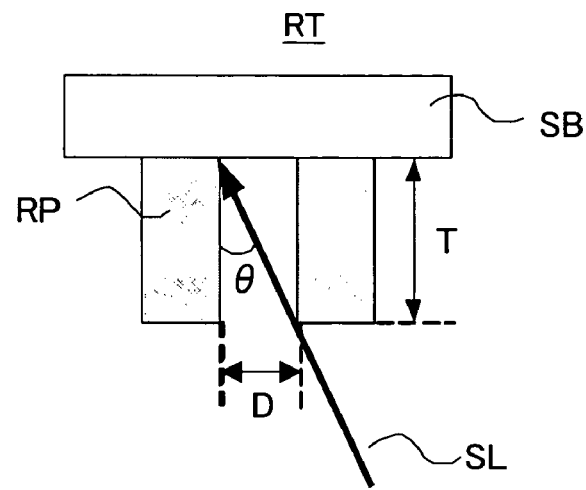
FIG. 5 is a schematic sectional view of the reticle showing a relationship between a reticle pattern and a light irradiation angle.

FIG. 5 is a schematic sectional view of the reticle RT showing an irradiation angle of the light SL and the reticle pattern RP. Referring to FIG. 5, the reticle pattern RP has a thickness T and an interval or width D between two adjacent patterns on the substrate SB. The light SL irradiated onto the reticle RT is incident at an angle $\theta$ from a normal of the reticle RP. When the incident angle $\theta$ meets a condition $D/T > \tan \theta \geq 0$, the light SL can reach the substrate SB at a position where no reticle pattern RP is formed, without being blocked by the reticle pattern RP. Thus, the light SL is irradiated onto the particle in the reticle pattern RP on the substrate SB.

While the above embodiments use the condensed light that originates from a light source for the light to be irradiated onto the reticle, a remover having higher removing efficiency can be configured by adjusting a phase or amplitude distribution of the light from the light source.

Figure 6:
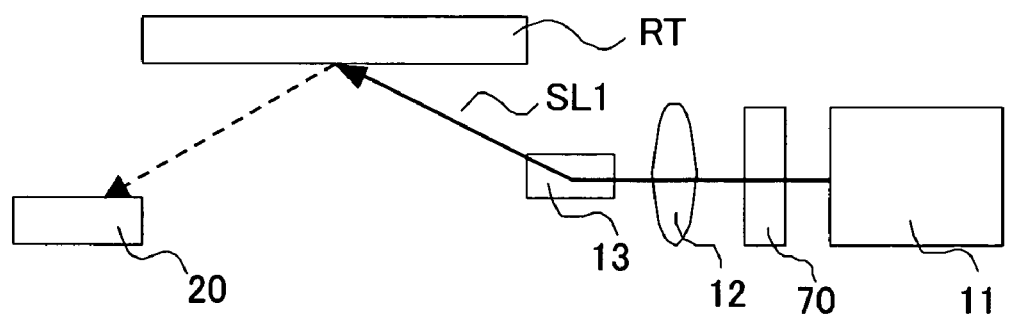
FIG. 6 is a schematic block diagram of a structure of a particle remover having a light modulator.

FIG. 6 shows a remover 1 having a light modulator 70 that has a variable phase and amplitude distribution of the light from the light source 11. In FIG. 6, the light generated from the light source 11 transmits the light modulator 70, and is irradiated onto and condensed by the condenser lens 12. The light scanning optical system 13 scans the condensed light, and the scanned light SL1 is irradiated onto the reticle RT surface. Thus, the particle on the reticle RT is captured by the light SL1 and collected by the collector 20.

Figure 7:
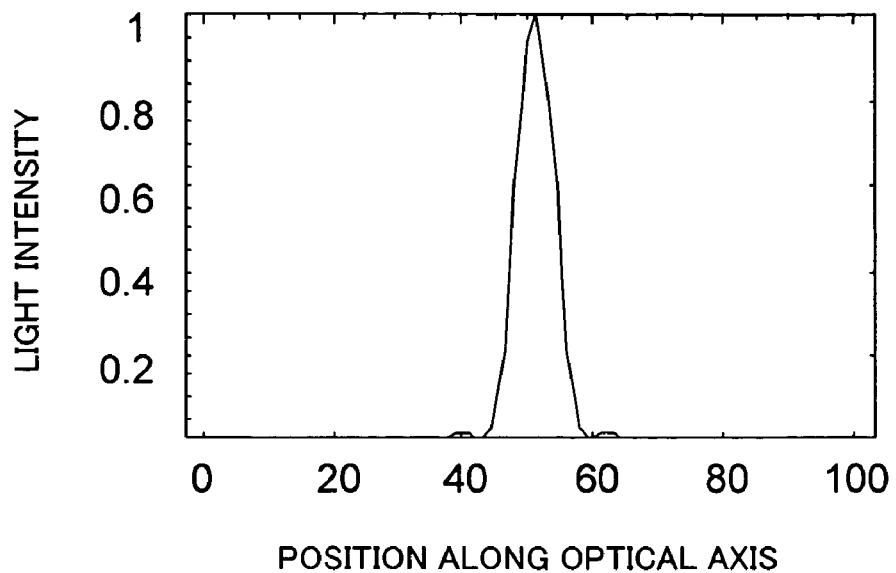
FIG. 7 is a view of an illustrative light intensity distribution when the light modulator shown in FIG. 6 does not act.
Figure 8:
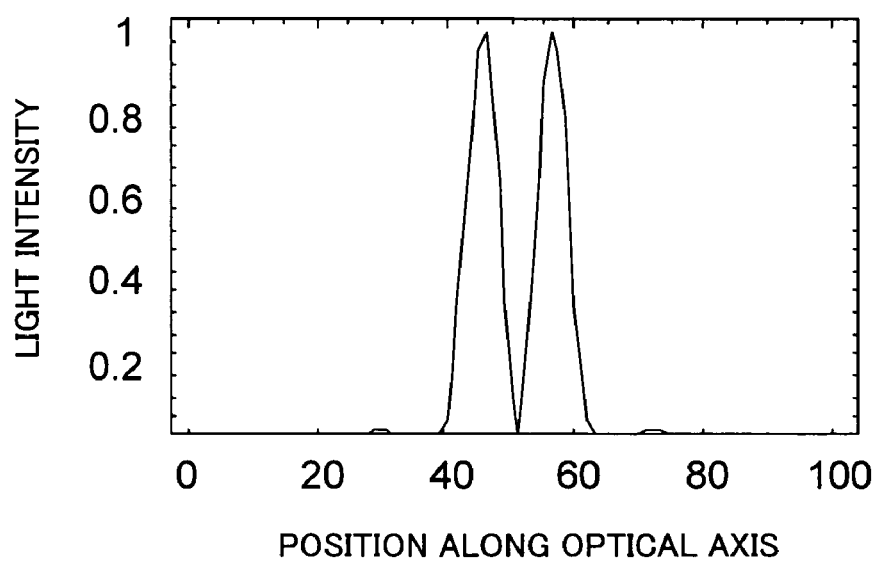
FIG. 8 is a view of an illustrative light intensity distribution when the light modulator shown in FIG. 6 acts.

FIGS. 7 and 8 each show one section of the light intensity distribution of the light SL1 along the optical axis, where the abscissa axis denotes a position along the optical axis and the ordinate axis denotes the light intensity. When the light modulator 70 does not act, the light intensity distribution of the condensed light SL1 that is cut by a circular opening has a section like an airy disc shown in FIG. 7.

A particle having a size of several tens nanometers deteriorates a pattern transfer characteristic of the reticle for an exposure apparatus. It is known that the optical trap power used to remove the particle or the light power to capture the particle depends upon the gradient of the light intensity when the particle diameter is smaller than the wavelength of lights. When the particle diameter is greater than the wavelength of lights and the particle is a metallic particle, the repulsion between the light and the particles increase. The light whose light intensity has an airy disc or Gaussian shape has a difficulty in stably trapping such a particle, and the annular or donut light intensity distribution that is low around the optical axis center achieves stable trapping.

For example, when the light modulator 70 provides the light with a phase distribution that changes in a circumferential direction around the optical axis, the light having a donut intensity distribution that is low around the optical axis center as shown in FIG. 8. Thereby, it is possible to stably trap and remove the particle greater than the wavelength and the metallic particle. Control over a polarization state would provide similar effects to the phase and amplitude distributions.

The light power affecting the particle depends upon the dielectric constant of the particle and the dielectric constant differs according to the light wavelength even if the material is the same, as disclosed in the above prior art reference entitled "Optical trapping of metallic Rayleigh particles." Since the light wavelength that maximizes the power affecting the particle differs according to the material of the particle, the particles that cannot be removed by a single wavelength light source due to their materials remain on the reticle. Changing of a wavelength of the light from the light source 11 and providing plural light sources 11 emitting lights having different wavelengths can remove particles made of different materials and are implemented by the light source a tunable laser, a tunable filter, and a wavelength conversion element etc.

As discussed above, the above particle removers can remove the particles from the reticle in a non-contact manner without damages of a reticle pattern. In addition, the above particle removers improve the removing efficiency by changing the light irradiation direction to remove the particles from the reticle and by previously storing the reticle pattern.

Figure 9:
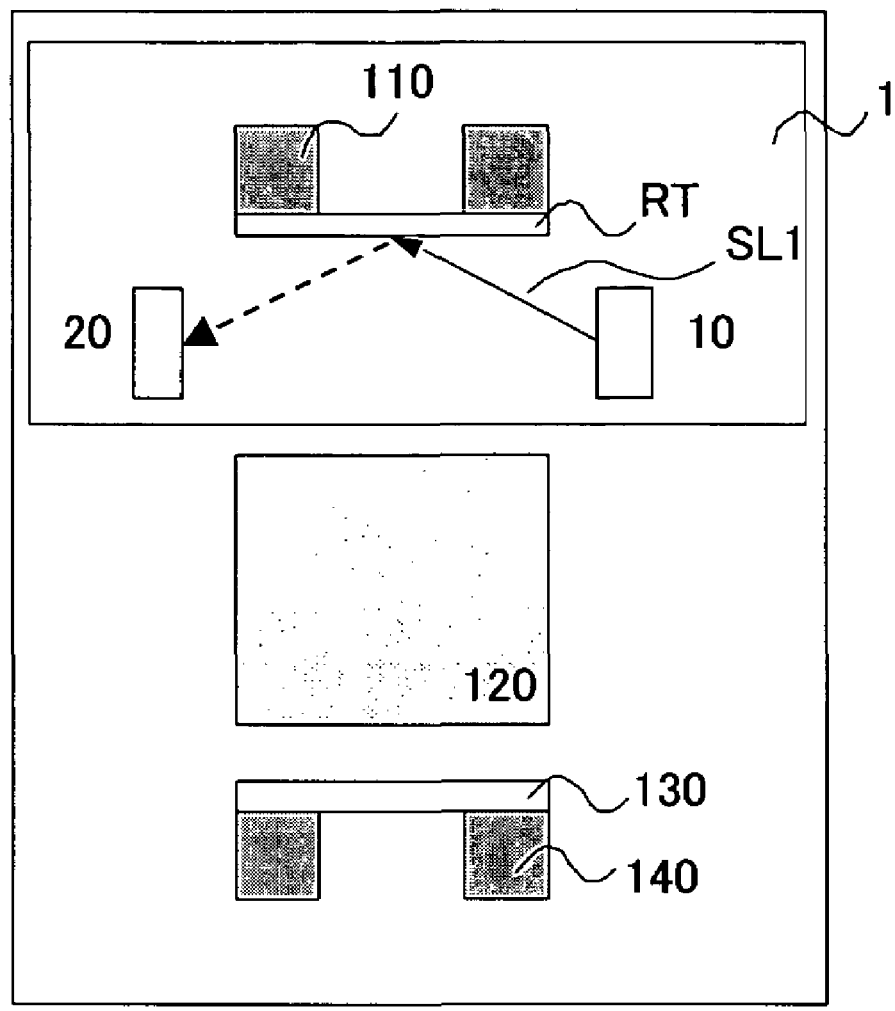
FIG. 9 is a schematic block diagram showing a structure of an exposure apparatus according to one aspect of the present invention.
Figure 10:
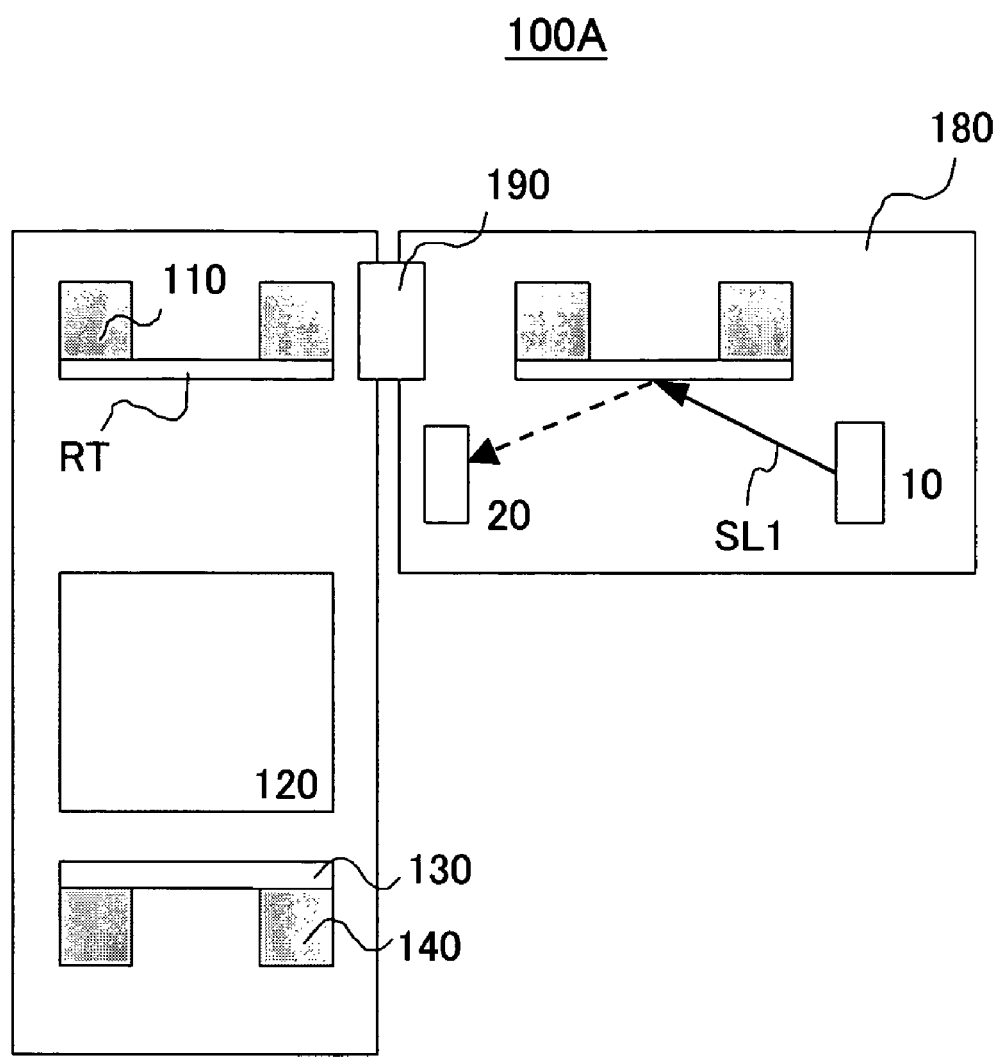
FIG. 10 is a schematic block diagram showing a structure of a variation of the exposure apparatus shown in FIG. 9.

Referring now to FIG. 9, a description will be given of an illustrative exposure apparatus 100 that includes the inventive remover. Here, FIG. 9 is a schematic block diagram of a structure of the exposure apparatus 100 according to one aspect of the present invention.

The inventive exposure apparatus 100 is a projection exposure apparatus that exposes a circuit pattern of the reticle RT onto a substrate 130 in a step-and-scan or step-and-repeat manner. Such an exposure apparatus is suitable for the lithography process below submicron or quarter-micron, and a description will be given below of this embodiment exemplarily using a step-and-scan exposure apparatus (which is also referred to as "a scanner"). The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 100 includes, as shown in FIG. 9, an illumination apparatus (not shown), a reticle stage 110 that mounts the reticle RT, a projection optical system 120, and a wafer stage that mounts the substrate 130.

The illumination apparatus (not shown) illuminates the reticle RT having a circuit pattern to be transferred, and includes a light source section and an illumination optical system.

A light source in the light source section can use, for example, an ArF excimer laser having a wavelength of about 193 nm and a KrF excimer laser having a wavelength of about 248 nm. However, the type of the laser is not limited to the excimer laser, and the light source may use a $F_2$ laser having a wavelength of about 157 nm and the EUV light having a wavelength between 10 nm and 15 nm. The number of the light sources is not limited. However, the present invention is particularly effective to the EUV light that is incompatible with a pellicle, as discussed above.

The illumination optical system is an optical system that illuminates the reticle RT, and includes a lens, a mirror, an optical integrator, a stop and the like, for example, a condenser lens, a fly-eye lens, an aperture stop, a condenser lens, a slit, and an imaging optical system in this order. The illumination optical system 114 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive optical element.

The reticle RT is a reflection or transmission reticle, and has a circuit pattern to be transferred. The reticle RT is supported and driven by a reticle stage 110. The diffracted light emitted from the reticle RT is projected onto the substrate 130 after reflected by the projection optical system 120. The reticle RT and substrate 130 are arranged optically conjugate with each other. Since the exposure apparatus 200 of this embodiment is a scanner, the reticle RT and substrate 130 are scanned to project a pattern on the reticle RT, onto the plate 230. When the exposure apparatus is a step-and-repeat exposure apparatus (also referred to as a "stepper"), the reticle RT and the object 130 are exposed while maintained stationary.

The reticle stage 110 supports the reticle RT via a reticle chuck (not shown), and is connected to a moving mechanism (not shown). The moving mechanism (not shown) includes a linear motor, etc., and moves the reticle RT by driving the mask stage 110 in XYZ-axes directions and rotational directions around these axes direction. The exposure apparatus 100 scans the reticle RT and the substrate 130 synchronously. The Y-axis direction is a scan direction within a surface of the reticle RT or substrate 130. The X-axis direction is a direction perpendicular to the Y-axis direction. The Z-axis direction is a direction perpendicular to a surface of the reticle RT or substrate 130.

The remover 1 removes the particles from the reticle RT surface. The remover 1 may apply the above embodiment, and a detailed description will be omitted. The remover 1 can remove the particles from the reticle RT without taking the reticle RT out of the exposure apparatus 100. Since the remover 1 dispenses with the detaching step and cleansing step, decreases defects on the transferred pattern, and maintains an excellent imaging characteristic at a low cost and high throughput.

The projection optical system 130 is an optical system that projects the light reflecting a pattern on the reticle RT as an object plane onto the substrate 130 as an image plane. The projection optical system 130 may use a dioptric optical system that includes only plural lens elements, a catadioptric optical system comprised of a plurality of lens elements with at least one concave mirror, and a catoptric optical system including only mirrors, and so on. Any necessary correction of a chromatic aberration in the projection optical system 130 can use a plurality of lens elements made from glass materials having different dispersion or Abbe values, or arrange a diffraction optical element such that it disperses in a direction opposite to that of the lens element.

The wafer stage 140 supports the substrate 130 via a wafer chuck (not shown). Similar to the reticle stage 110, the wafer stage 140 may use a linear motor to move the substrate 130 in the XYZ-axes directions and rotational directions around these axes directions. The positions of the reticle stage 110 and wafer stage 140 are monitored, for example, by a laser interferometer and the like, and they are driven at a constant speed ratio. The wafer stage 140 installed on a stage stool supported on the floor and the like, for example, via a damper. The reticle stage 110 and the projection optical system 120 are provided, for example, on a barrel stool (not shown) that is supported on a base frame placed on the floor, for example, via a damper.

In exposure, the light emitted from the illumination apparatus (not shown), for example, Koehler-illuminates the reticle RT. The light that has been reflected by the reticle RT and reflects the pattern forms an image on the substrate 130 via the projection optical system 120. The exposure apparatus 100 that has the remover 1 dispenses with the detaching step and cleansing step of the reticle RT, and maintains the throughput. The exposure apparatus 100 maintains the reticle's exchange cost by removing the particles without damaging the reticle pattern on the reticle RT. The remover 1 efficiently removes the particles on the reticle RT, and prevents defects on the transferred pattern. Therefore, the exposure apparatus 100 can provide high-quality devices (such as semiconductor devices, LCD devices, image pick-up devices (such as CCDs), and thin film magnetic heads) with excellent throughput and economical efficiency.

Instead of incorporating the remover 1, a particle removing chamber 180 that houses the remover 1 may be provided. A reticle exchange mechanism 190 removes the particles out of the reticle RT and maintains the throughput before the reticle RT is used for the exposure for the exposure apparatus 100A that carries the reticle RT.

Figure 11:
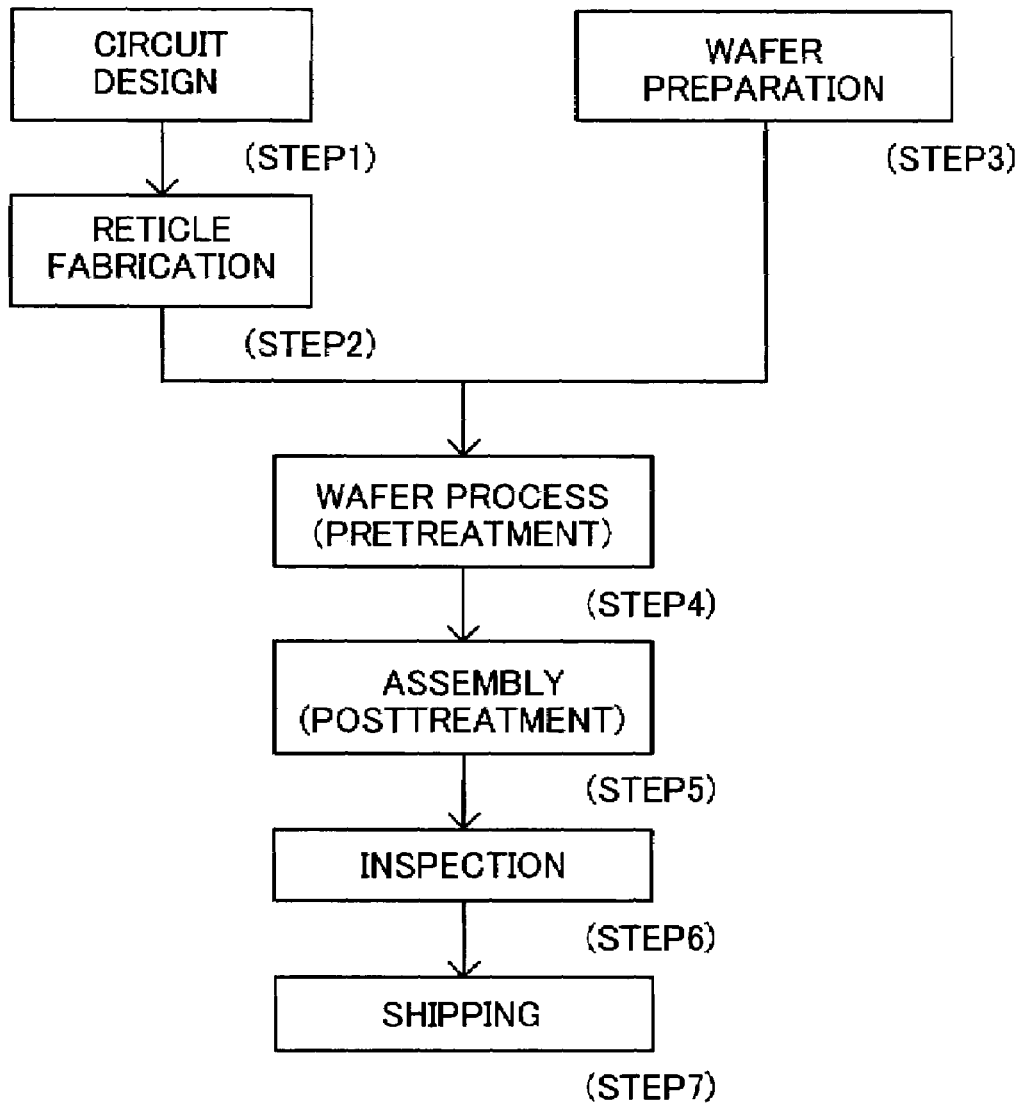
FIG. 11 is a flowchart for explaining manufacture of devices (such as semiconductor chips such as ICs and LCDs, CCDs, and the like).
Figure 12:
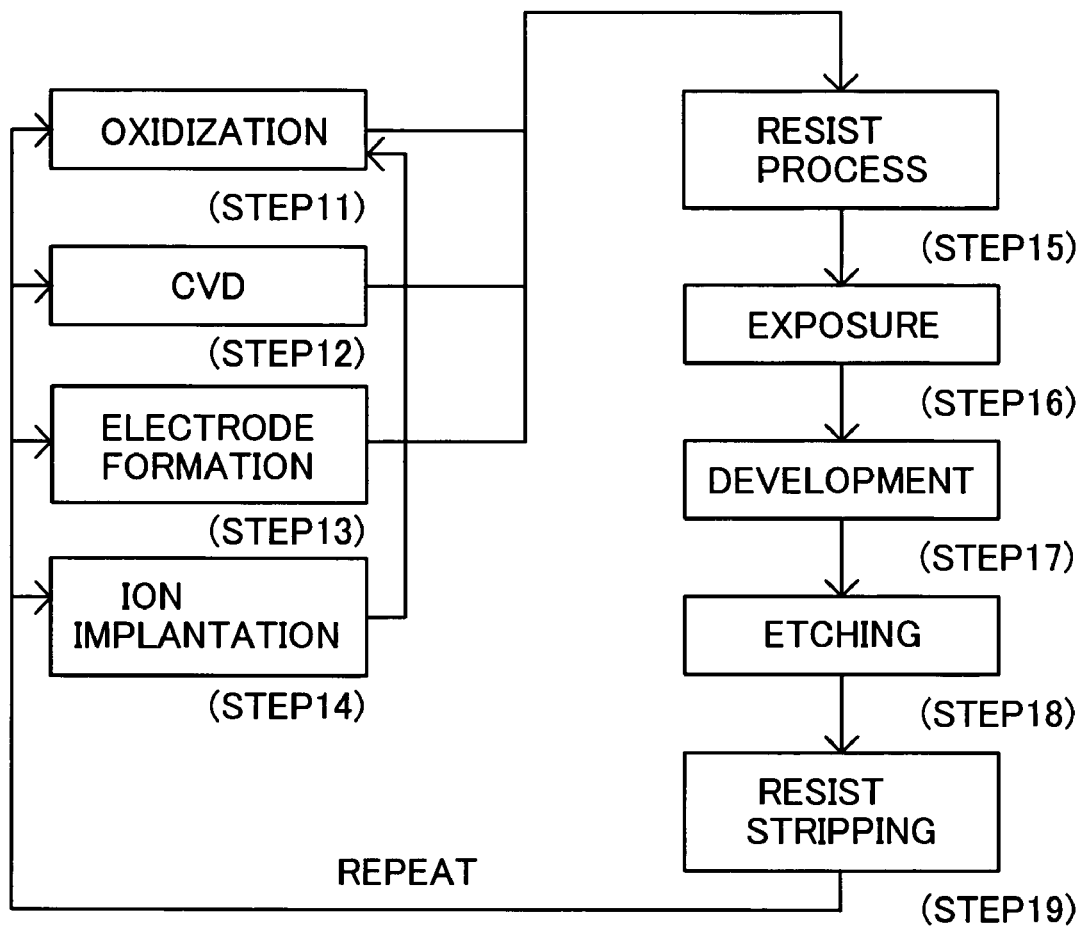
FIG. 12 is a detail flowchart of a wafer process as Step 4 shown in FIG. 11.
Figure 13:
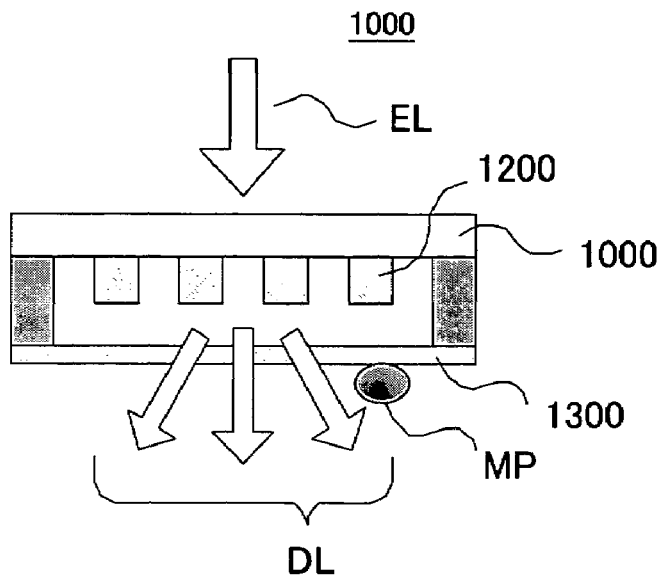
FIG. 13 is a schematic sectional view showing a conventional reticle having a pellicle.
Figure 14:
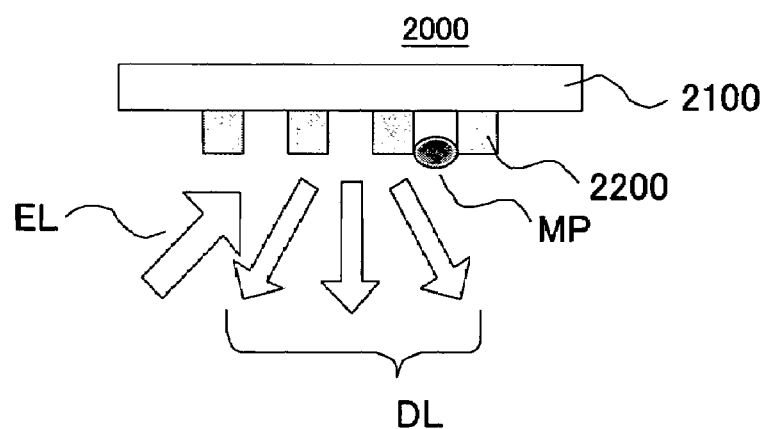
FIG. 14 is a reticle used for an EUV exposure apparatus.

Referring to FIGS. 11 and 12, a description will now be given of an embodiment of a device manufacturing method using the above exposure apparatus 100. FIG. 11 is a flowchart for explaining a manufacture of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (reticle fabrication) forms a reticle RT having a designed circuit pattern. Step 3 (wafer preparation) manufactures a wafer using materials such as silicon. Step 4 (wafer process), which is referred to as a pretreatment, forms actual circuitry on the wafer through photolithography using the reticle RT and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the reticle RT onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacturing method of the instant embodiment may manufacture higher quality devices than conventional. In this manner, the device manufacturing method that uses such an exposure apparatus 100 and the resultant device constitute another aspect of the present invention.

Further, the present invention is not limited to these preferred embodiments, and various variations and modifications may be made without departing from the scope of the present invention.

This application claims a benefit of priority based on Japanese Patent Application No. 2004-307860, filed on Oct. 22, 2004, which is hereby incorporated by reference herein in its entirety as if fully set forth herein.

What is claimed is:

1. A particle remover comprising:
    an irradiation unit for irradiating plural lights onto a target from different directions, and for scanning the lights on the target; and
    a collector for collecting particles carried as a result of scanning of the lights;
    wherein said irradiation unit irradiates the target so that at least one of the plural lights is not blocked by a solid protruding artifact of the target.

2. A particle remover according to claim 1, further comprising a beam splitter for splitting light from a single light source into the plural lights,
    wherein said irradiation unit irradiates the plural lights that have been split, from the different directions onto the target.

3. A particle remover according to claim 1, wherein the irradiation unit irradiates plural lights onto the target on at least two orthogonal planes.

4. A particle remover according to claim 1, further comprising a memory for storing information of said solid protruding artifact, and
    wherein said irradiation unit changes a direction of the light based on the information stored in the memory.

5. A particle remover according to claim 1, wherein said irradiation unit irradiates the plural lights so as to meet a condition $D/T \geq \tan \theta$, where T is a height of the solid protruding artifact at a position that receives the plural lights, D is a width of the position, and $\theta$ is an incident angle of one of the lights.

6. A particle remover according to claim 1, further comprising a light modulator that modulates the light irradiated onto the target.

7. A particle remover according to claim 6, wherein said light modulator changes a phase of the light.

8. A particle remover according to claim 6, wherein said light modulator changes an amplitude distribution of the light.

9. A particle remover according to claim 1, wherein the plural lights have different wavelengths.

10. A particle remover according to claim 1, wherein said irradiation unit is configured to change a wavelength of each of the plural lights.

11. An exposure apparatus comprising:
    a particle remover according to claim 1; and
    an optical system for exposing onto a substrate a pattern of a reticle, from which a particle is removed by said particle remover.

12. A device manufacturing method comprising the steps of:
    exposing a substrate using an apparatus as defined in claim 11; and
    developing the substrate that has been exposed object.

* * * * *

UNITED STATES PATENT AND TRADEMARK OFFICE
CERTIFICATE OF CORRECTION

| | |
|---|---|
| PATENT NO. | : 7,414,240 B2 |
| APPLICATION NO. | : 11/255530 |
| DATED | : August 19, 2008 |
| INVENTOR(S) | : Akinori Ohkubo, Kenji Yamazoe and Hiroshi Osawa |

It is certified that error appears in the above-identified patent and that said Letters Patent is hereby corrected as shown below:

ON THE FACE OF THE PATENT:

On the Title page, Item (56), the reference listed under Other Publications as "manipulation of neural particles" should read --manipulation of neutral particles--.

Signed and Sealed this

Eighteenth Day of November, 2008

JON W. DUDAS
*Director of the United States Patent and Trademark Office*